(12) United States Patent
Blakeley, III

(10) Patent No.: US 7,163,336 B2
(45) Date of Patent: Jan. 16, 2007

(54) INSTRUMENT FOR NON-CONTACT INFRARED TEMPERATURE MEASUREMENT HAVING CURRENT CLAMP METER FUNCTIONS

(75) Inventor: Gerald W Blakeley, III, Lincoln, MA (US)

(73) Assignee: Extech Instruments Corporation, Waltham, MA (US)

( * ) Notice: Subject to any disclaimer, the term of this patent is extended or adjusted under 35 U.S.C. 154(b) by 0 days.

(21) Appl. No.: 10/910,894

(22) Filed: Aug. 4, 2004

(65) Prior Publication Data

US 2005/0031013 A1 Feb. 10, 2005

Related U.S. Application Data

(60) Provisional application No. 60/492,414, filed on Aug. 4, 2003.

(51) Int. Cl.
*G01K 1/02* (2006.01)
*G01K 1/14* (2006.01)
*G01J 5/02* (2006.01)

(52) U.S. Cl. .................. 374/142; 374/120; 374/208

(58) Field of Classification Search ............. 374/130, 374/120, 121, 208, 141, 183, 163, 132, 142
See application file for complete search history.

(56) References Cited

U.S. PATENT DOCUMENTS

| 2,783,437 | A | * | 2/1957 | Yenni et al. ............... 324/129 |
| 2,834,941 | A | * | 5/1958 | Hickok, Jr. et al. ......... 324/127 |
| 3,351,855 | A | * | 11/1967 | Scott ........................... 324/163 |
| 3,431,781 | A | * | 3/1969 | Wiggin .......................... 374/1 |
| 3,840,808 | A | * | 10/1974 | Liebermann ................. 324/127 |
| 4,513,246 | A | * | 4/1985 | Blain ........................... 324/127 |
| 4,704,575 | A | * | 11/1987 | Arnoux et al. .......... 324/117 H |
| RE34,507 | E | * | 1/1994 | Egawa et al. ................ 374/126 |
| 5,349,289 | A | * | 9/1994 | Shirai ........................... 324/127 |
| 5,836,694 | A | * | 11/1998 | Nguyen ........................ 374/130 |
| 5,839,829 | A | * | 11/1998 | Litvin et al. ................. 374/121 |
| 6,043,640 | A | * | 3/2000 | Lauby et al. ................. 324/127 |
| 6,095,682 | A | * | 8/2000 | Hollander et al. ............ 374/121 |
| 6,196,714 | B1 | * | 3/2001 | Bellifemine et al. ......... 374/121 |
| 6,234,669 | B1 | * | 5/2001 | Kienitz et al. ............... 374/130 |
| 6,975,104 | B1 | * | 12/2005 | Gregorec, Jr. ................ 324/126 |
| 7,056,012 | B1 | * | 6/2006 | Blakeley, III ................ 374/120 |
| 2004/0066833 | A1 | * | 4/2004 | Blakeley, III ................ 374/120 |
| 2005/0184722 | A1 | * | 8/2005 | Gregorec, Jr. ............... 324/126 |

FOREIGN PATENT DOCUMENTS

GB 2331581 A * 5/1999
JP 2004069641 A * 3/2004

* cited by examiner

*Primary Examiner*—Gail Verbitsky
(74) *Attorney, Agent, or Firm*—Brian M. Dingman, Esq.; Mirick, O'Connell, DeMallie & Lougee

(57) ABSTRACT

A handheld instrument that accomplishes infrared (IR) temperature measurement and non-contact electrical current measurement. The instrument has a case, a current-sensing device coupled to the case and operable to be placed around a conductor, for generating an output signal based on the current flowing through the conductor, and an IR detector carried by the case, for sensing IR energy emitted from a surface being measured along a sensing axis that extends from the case, and generating an IR output signal. Sensed IR energy is converted to a temperature value, and the output signal from the current-sensing device is converted to at least a measured current value. There is a display device in the case, for displaying instrument measurements to the user.

20 Claims, 8 Drawing Sheets

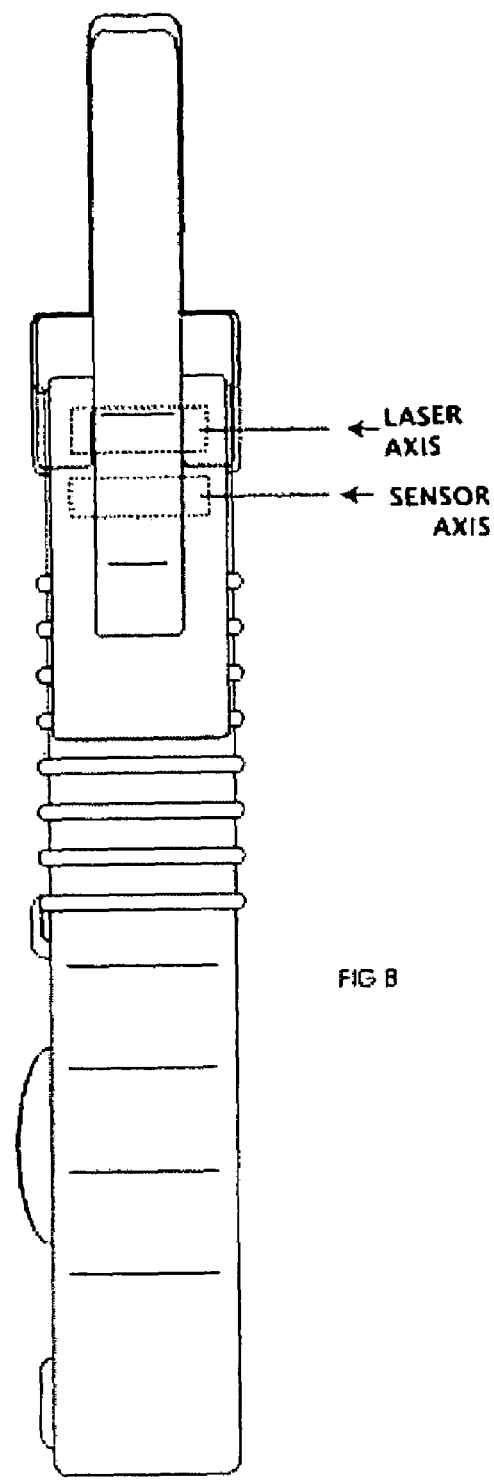

INSTRUMENT FOR NON-CONTACT INFRARED TEMPERATURE MEASUREMENT HAVING CURRENT CLAMP METER FUNCTIONS

CROSS REFERENCE TO RELATED APPLICATION

This application claims priority of Provisional application Ser. No. 60/492,414, filed on Aug. 4, 2003.

FIELD OF THE INVENTION

This invention comprises an instrument having the functionality of both an infrared (IR) temperature measurement device and a current clamp meter.

BACKGROUND OF THE INVENTION

Many applications require both non-contact temperature measurements along with measurement of electrical parameters. Present practices require the use of two different instruments to perform these tasks. This adds to expense, and is inconvenient for the user.

SUMMARY OF THE INVENTION

It is therefore a primary object of this invention to provide a handheld instrument that accomplishes the functionality of a current clamp meter and also is capable of infrared temperature measurements of a surface.

It is a further object of this invention to provide such an instrument in which the temperature measurement can be held in the display for a time after it is taken, to allow the user to look at the display in a more convenient setting.

It is a further object of this invention to provide such an instrument that is fully self-contained.

This invention features a handheld instrument that accomplishes infrared (IR) temperature measurement and non-contact electrical current measurement. The instrument has a case, a current-sensing device coupled to the case and operable to be placed around a conductor, for generating an output signal based on the current flowing through the conductor, and an IR detector carried by the case, for sensing IR energy emitted from a surface being measured along a sensing axis that extends from the case, and generating an IR output signal. There are means for converting sensed IR energy to a temperature value, and for converting the output signal from the current-sensing device to at least a measured current value. A display device in the case displays instrument measurements to the user.

The handheld instrument may further comprise an aiming device carried by the case for emitting a visible beam along an aiming axis, to assist the operator in aiming the IR detector. The aiming device may comprise a laser diode. The aiming axis is preferably close to the sensing axis. The aiming axis and the sensing axis may be essentially parallel to one another, or may be fixed at a slight angle to one another.

The means for converting sensed IR energy to a temperature may accomplish a fixed emissivity. The means for converting may comprise an analog to digital converter (ADC) for digitizing the current-sensing device output signal and the IR output signal. The handheld instrument may further comprise means for maintaining a sensed temperature on the display device until after the IR detector is no longer aimed at the surface being measured.

The handheld instrument of the invention may further comprise a power source carried within the case, for supplying power to at least the IR detector, the means for converting, and the display device. The power source may comprise a DC power source, which may be a battery. The handheld instrument may further comprise a switch to control which signal is displayed. The display device may be a digital display device or an analog display device. The aiming axis and the sensing axis may both intersect the end of the case. Alternatively, the axes may both intersect the back of the case.

Also featured in the invention is a handheld instrument that accomplishes infrared (IR) temperature measurement and non-contact electrical current measurement, comprising a case, a current-sensing device coupled to the case and operable to be placed around a conductor, for generating an output signal based on the current flowing through the conductor, an IR detector carried by the case, for sensing IR energy emitted from a surface being measured along a sensing axis that extends from the case, and generating an IR output signal, a laser diode aiming device carried by the case for emitting a visible beam along an aiming axis, to assist the operator in aiming the IR detector, means for converting sensed IR energy to a temperature value using a fixed emissivity, and for converting the output signal from the current-sensing device to at least a measured current value, a display device in the case, for displaying instrument measurements to the user, and a battery power source carried within the case, for supplying power to at least the IR detector, the laser diode, the means for converting, and the display device. The fixed emissivity may be set to about 0.95. The aiming axis is preferably close to the sensing axis; they may be essentially parallel to one another or fixed at a slight angle to one another.

BRIEF DESCRIPTION OF THE DRAWINGS

Other objects, features and advantages will occur to those skilled in the art from the following description of the preferred embodiments and the accompanying drawings, in which:

FIGS. 7 and 8 are bottom and right side views, respectively, of an alternative embodiment in which the IR sensing device and aiming laser diode axes intersect the bottom of the instrument.

DETAILED DESCRIPTION OF THE PREFERRED EMBODIMENTS

In the invention, the common functions of IR temperature measurement and those of a Current Clamp Meter are combined into one circuit with a common display and other functional aspects. The housing is designed to include the IR sensing element, and an optional laser-based IR sensor aiming device.

Figure 1:
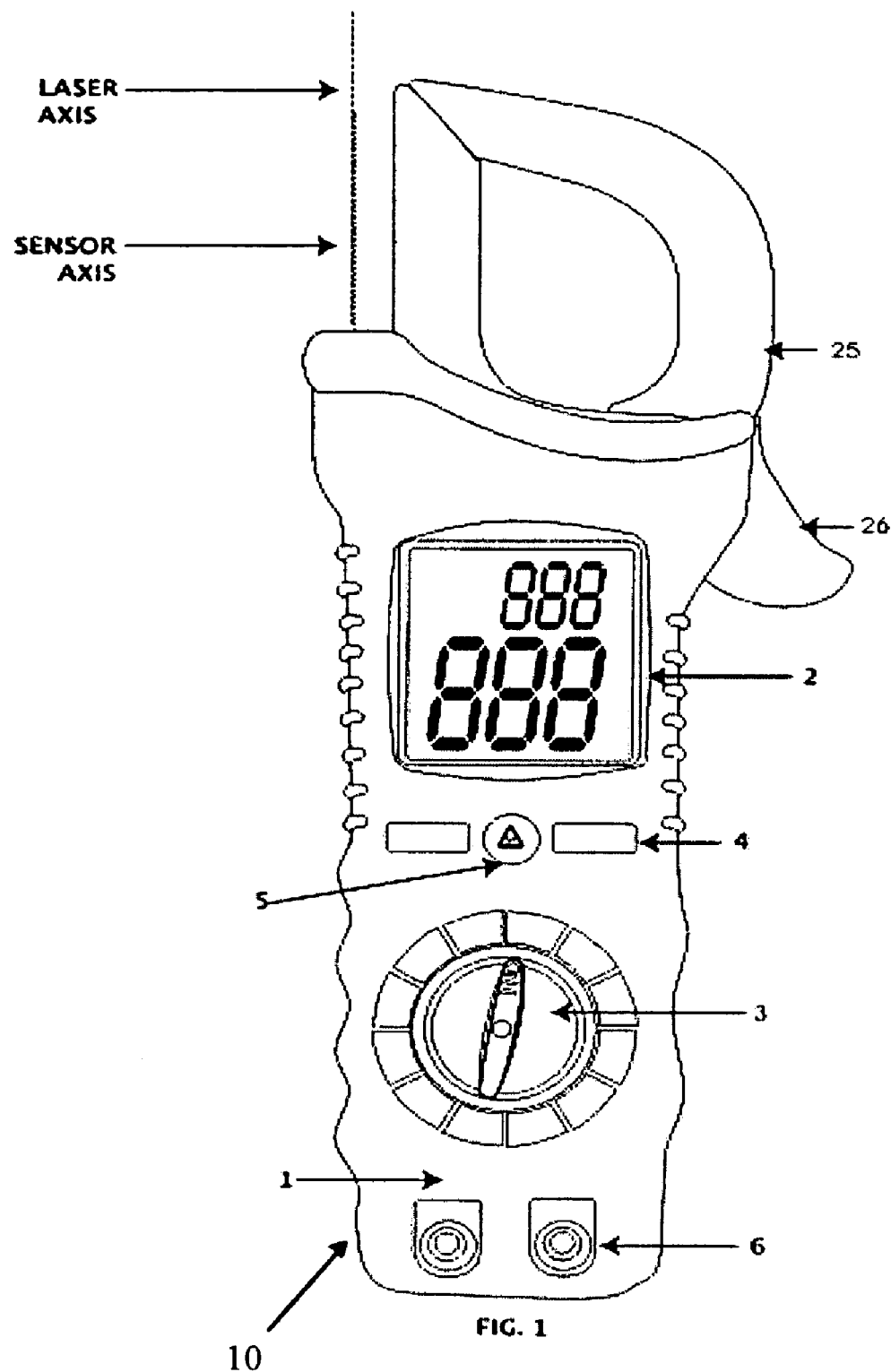
FIG. 1 is a top view of the preferred embodiment of the handheld instrument for non-contact infrared temperature measurement having current clamp meter functions, according to this invention.
Figure 2:
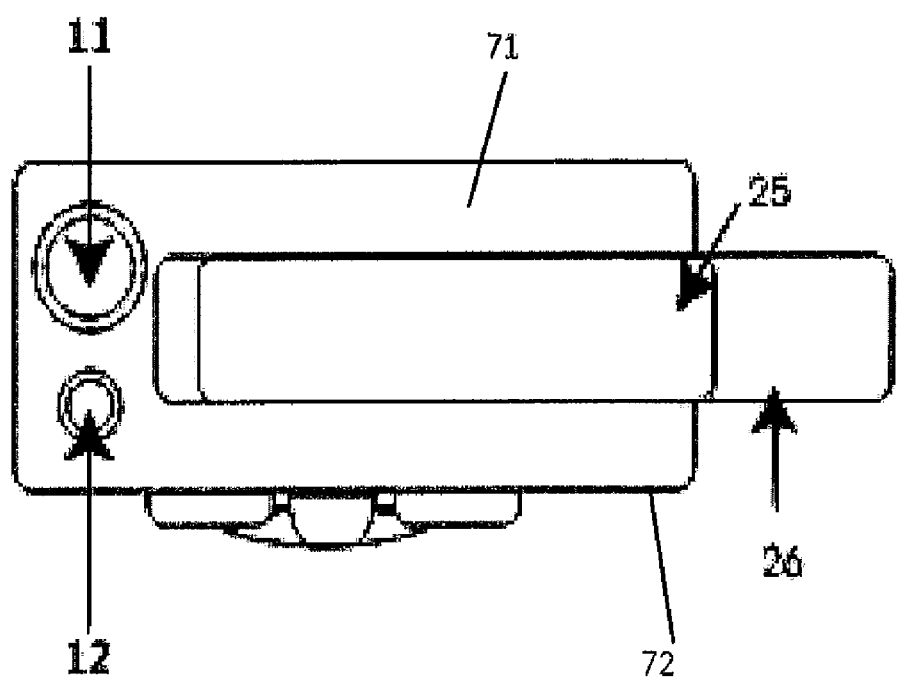
FIG. 2 is an end view of the instrument of FIG. 1, showing case end 71 and case top 72.

The mechanical arrangement of the preferred embodiment is shown in FIGS. 1 & 2. FIG. 1 is a top view of device 10 of this invention. Device 10 comprises housing or case 1 to contain the functions in a convenient hand-held unit, digital display 2 for displaying to the user the values being measured, rotary switch 3 to select a multiplicity of functions with a multiplicity of ranges, and pushbuttons 4 to perform further selection of parameters or functions in combination with rotary switch 3. Other embodiments may use these pushbuttons and switches in combination or alone to achieve the same result. In addition (and not shown here) slide switches and keypads may also be used. Two or more combinations of jacks 6 can be used together with optional test leads to input optional multimeter signals.

FIG. 2 is an end view of device 10. This shows one arrangement of infrared (IR) detector 11, which is used to measure the temperature of a surface or body without actual physical contact. Detector 11 accomplishes this by detecting the IR emissions given off by the object whose temperature is being measured. At a specific temperature, the emissions vary with the surface conditions, such as finish and color. This variation is a factor called emissivity. Each type of surface has an emissivity ranging from 0 (non-emissive) to 1, which is the emissivity of a matte black body. The emissivity of the preferred embodiment herein is fixed, for example at 0.95, although other emissivity constants could also be used. Most objects being measured have an emissivity constant reasonably close to 0.95. The result is a practical apparatus which is easy to use without having to be concerned with adjusting the emissivity value, or the emissivity being misadjusted.

FIG. 2 also shows aperture 12 in the end of the case through which a visible laser beam may be shone (typically from a laser diode) to assist in aiming detector 11 at the surface being measured. The laser and sensor axes may be close to and parallel to one another, or may be fixed at a slight angle to each other to reduce parallax at the surface being measured. Switch 5 turns on the laser aiming device and accepts the reading from the IR detector. In other embodiments, this switch may also be used to control the IR temperature readout, such as holding the reading for later viewing by the user. Other types of switches and locations may be used. It is sometimes desirable that the IR reading is taken when on the surface being measured and then held for easy reading later.

Figure 3:
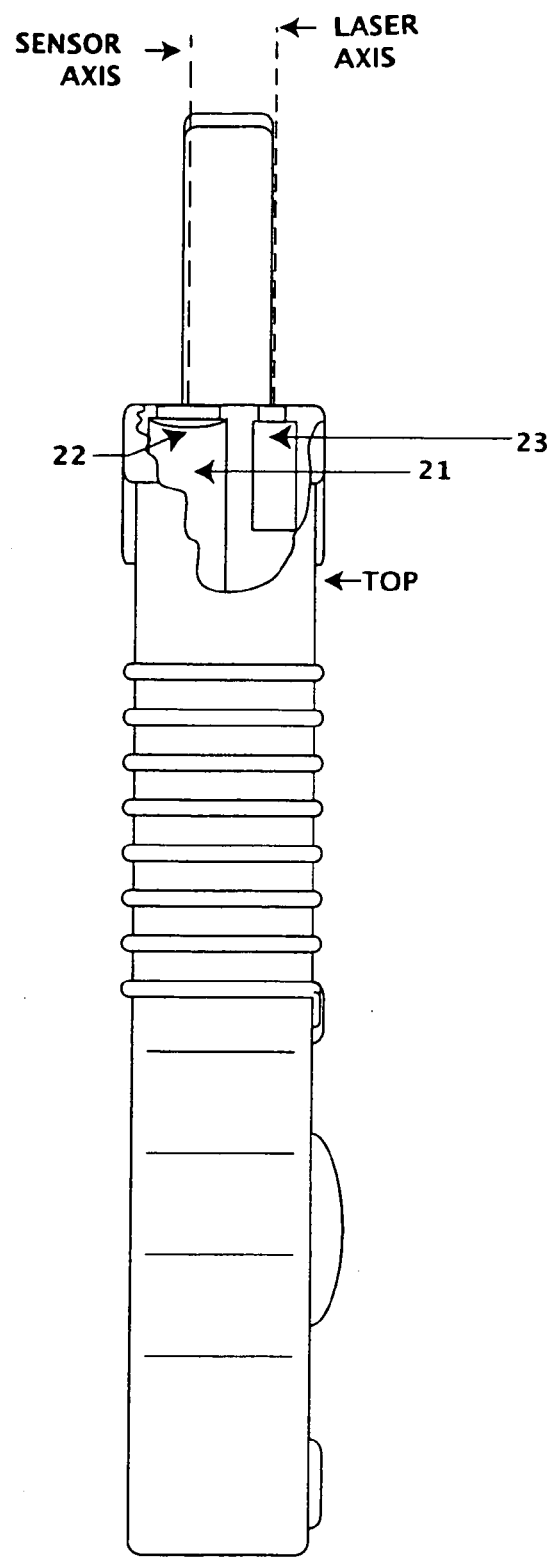
FIG. 3 is a partially cross-sectional left side view of instrument FIG. 1.
Figure 7:
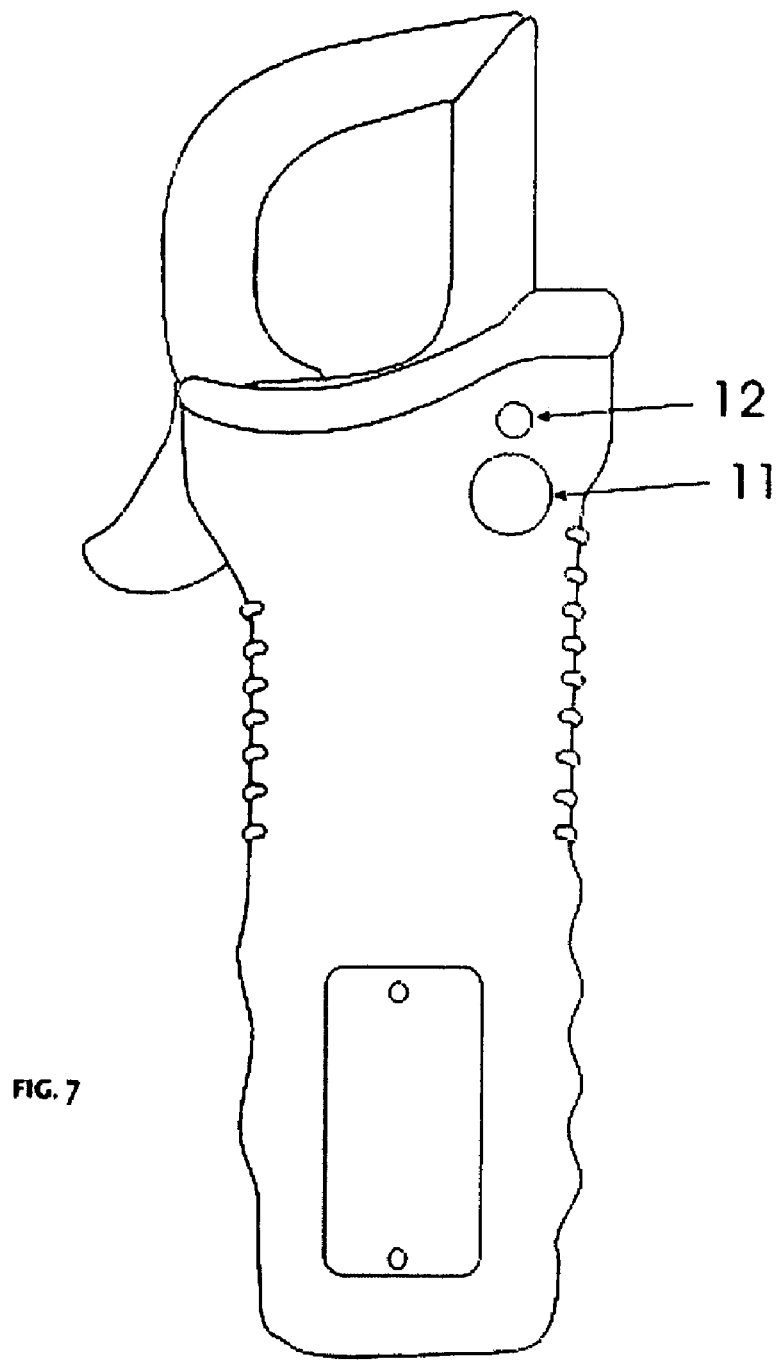

FIG. 3 is a partial cross-sectional view from the top of a typical arrangement of IR detector 21, and aiming laser 23. IR detector 21 may be focused, filtered and protected by lens 22. Other embodiments may have the IR detector and aiming laser mounted in a different location. An example would be having the laser and sensor axes exiting the rear of the case on axes that are perpendicular to the plane of the case, as shown in FIGS. 7 and 8.

Figure 4:
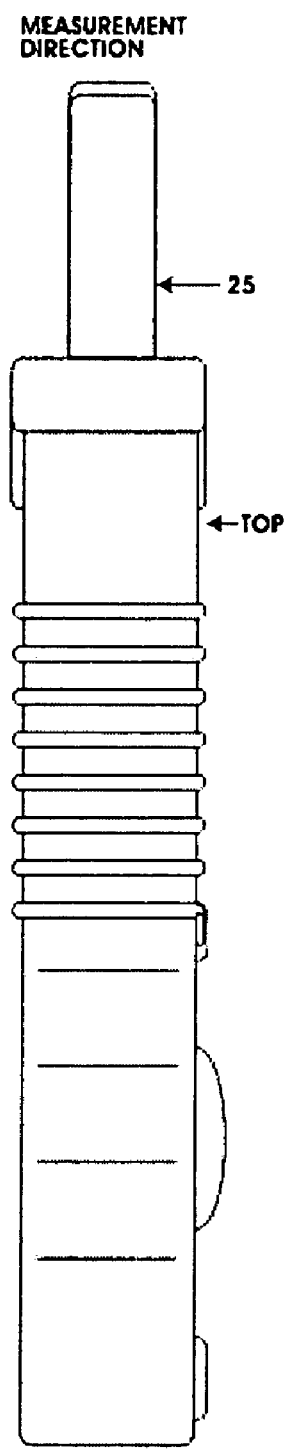
FIGS. 4 and 5 are left and right side views, respectively, of the instrument of FIG. 1.
Figure 5:
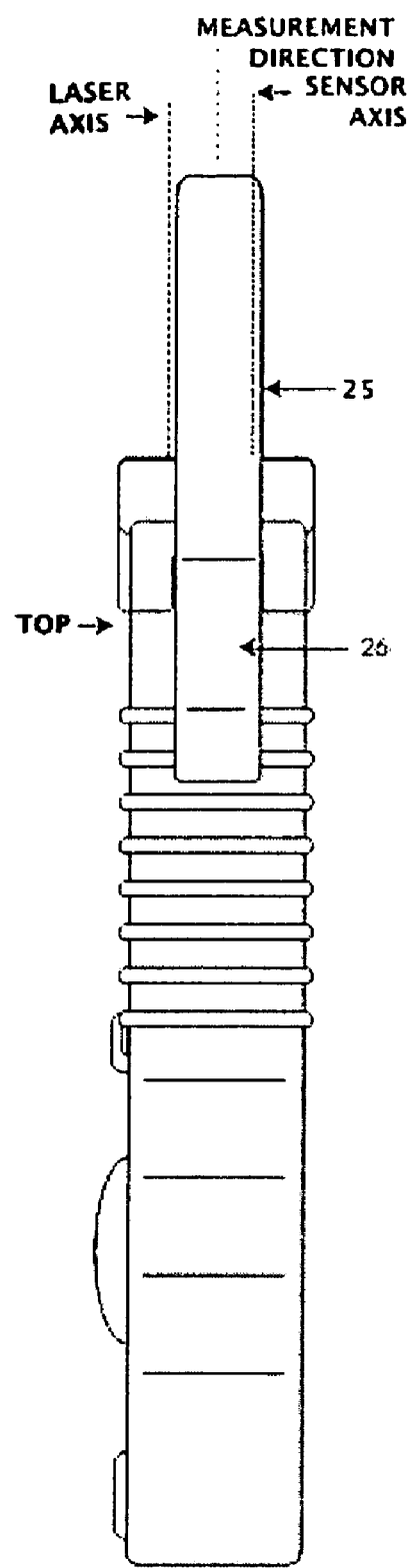

FIGS. 4 and 5 are left and right side views, respectively, that also show clamp 25 that is separated by push lever 26 that moves the right half of clamp 25 away from the left half, so that the clamp can be placed around a wire.

Figure 6:
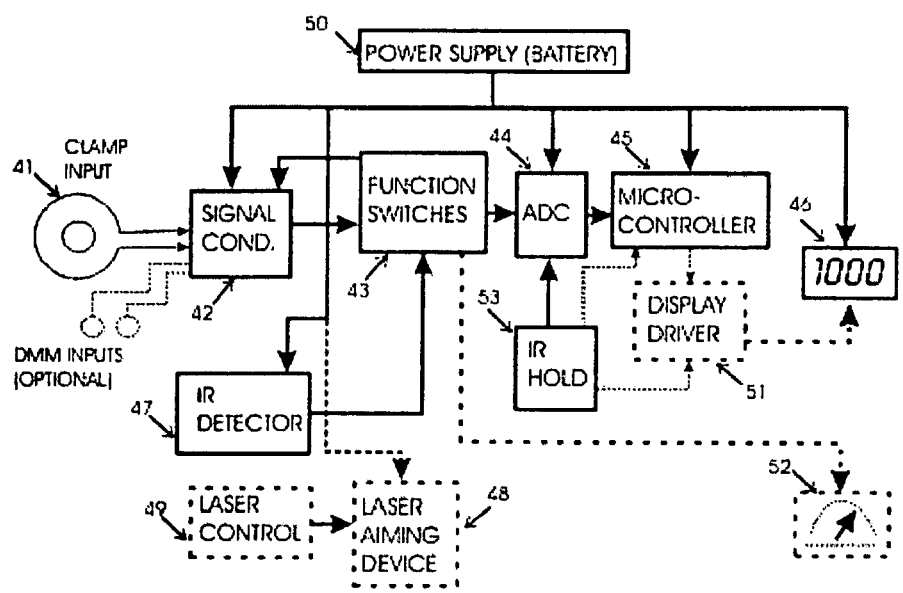
FIG. 6 is a block diagram of the circuit functions of the instrument of this invention.

FIG. 6 is a diagram of the circuit functions and shows the commonality of the devices shared by both the Current Clamp function and the IR measuring function. Clamp 41 is used to input the current signals being measured. The input signals are processed by signal conditioning or protection circuits 42. The conditioned input signals are then selected by function switches 43 for presentation to analog to digital converter (ADC) 44. Function switches 43 may also control the switching of attenuators, gain or other means to convert the measured signal to a more useful one, and to provide protection where needed in the signal conditioning circuits. In alternate embodiments, the signal conditioning function may be after the function switches or divided in front of and between the function switches and the ADC. The output from the ADC may go directly to display drivers 51, which may also be part of the ADC devices, or to microcontroller circuit 45. Microcontroller circuit 45 may also contain the ADC and/or display drivers. Digital displays 46 are driven directly from the microcontroller or the display drivers.

IR detector circuit 47 is also switched to the ADC by the function switches, similar to the current clamp input signals. Power supply 50, which usually consists of one or multiple batteries and regulating devices, provides power and reference signals as required to all of the functions described above. Other embodiments may provide a laser aiming device 48 and its control circuit 49, an IR hold circuit 53 which will hold the measured reading on the display, or may have an analog display 52 which would not require the use of an ADC or other digital circuits.

Other embodiments may also include a display capable of displaying multiple functions such as current and temperature or current and voltage.

Other embodiments will occur to those skilled in the art and are within the following claims:

What is claimed is:

1. A handheld instrument that accomplishes infrared (IR) temperature measurement and non-contact electrical current measurement, comprising:
   a case having a top and an end;
   a current-sensing device coupled to the case comprising a clamp extending outward from said end of the case and operable to be placed around a conductor, for generating an output signal based on the current flowing through the conductor;
   an IR detector carried by the case, for sensing IR energy emitted from a surface being measured along a sensing axis that extends from said end of the case, and generating an IR output signal;
   means for converting sensed IR energy to a temperature value, and for converting the output signal from the current-sensing device to at least a measured current value; and
   a display device in the case and visible at the top of the case, for displaying instrument measurements to the user.

2. The handheld instrument of claim 1, further comprising an aiming device carried by the case for emitting a visible beam along an aiming axis, to assist the operator in aiming the IR detector.

3. The handheld instrument of claim 2, wherein the aiming device comprises a laser diode.

4. The handheld instrument of claim 2, wherein the aiming axis is close to the sensing axis and also extends from the end of the case.

5. The handheld instrument of claim 4, wherein the aiming axis and the sensing axis are essentially parallel to one another.

6. The handheld instrument of claim 4, wherein the aiming axis and sensing axis are fixed at a slight angle to one another.

7. The handheld instrument of claim 1, wherein the means for converting sensed IR energy to a temperature accomplishes a fixed emissivity.

8. The handheld instrument of claim 1, wherein the means for converting comprises an analog to digital converter for digitizing the current-sensing device output signal and the IR output signal.

9. The handheld instrument of claim 1, further comprising means for maintaining a sensed temperature on the display device until after the IR detector is no longer aimed at the surface being measured.

10. The handheld instrument of claim 1, further comprising a power source carried within the case, for supplying power to at least the IR detector, the means for converting, and the display device.

11. The handheld instrument of claim 10, wherein the power source comprises a DC power source.

12. The handheld instrument of claim 11, wherein the DC power source comprises a battery.

13. The handheld instrument of claim 1, further comprising switch means to control which signal is displayed.

14. The handheld instrument of claim 1, wherein the display device is a digital display device.

15. The handheld instrument of claim 1, wherein the display device is an analog display device.

16. A handheld instrument that accomplishes infrared (IR) temperature measurement and non-contact electrical current measurement, comprising:
- a case having a top and an end;
- a current-sensing device coupled to the case comprising a clamp extending outward from said end of the case and operable to be placed around a conductor, for generating an output signal based on the current flowing through the conductor;
- an IR detector carried by the case, for sensing IR energy emitted from a surface being measured along a sensing axis that extends from said end of the case, and generating an IR output signal;
- a laser diode aiming device carried by the case for emitting a visible beam along an aiming axis that extends from said end of the case, to assist the operator in aiming the IR detector;
- means for converting sensed IR energy to a temperature value using a fixed emissivity, and for converting the output signal from the current-sensing device to at least a measured current value;
- a display device in the case and visible at the top of the case, for displaying instrument measurements to the user; and
- a battery power source carried within the case, for supplying power to at least the IR detector, the laser diode, the means for converting, and the display device.

17. The handheld instrument of claim 16, wherein the fixed emissivity is about 0.95.

18. The handheld instrument of claim 16, wherein the aiming axis is close to the sensing axis.

19. The handheld instrument of claim 18, wherein the aiming axis and the sensing axis are essentially parallel to one another.

20. The handheld instrument of claim 18, wherein the aiming axis and sensing axis are fixed at a slight angle to one another.

* * * * *